United States Patent
Kim

(10) Patent No.: US 12,550,670 B2
(45) Date of Patent: Feb. 10, 2026

(54) SUPPORT UNIT, LINE STORAGE UNIT, AND TRANSPORT SYSTEM INCLUDING THE SUPPORT UNIT

(71) Applicant: SEMES CO., LTD., Cheonan-si (KR)

(72) Inventor: Do Hyun Kim, Hwaseong-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 555 days.

(21) Appl. No.: 18/166,794

(22) Filed: Feb. 9, 2023

(65) Prior Publication Data
US 2024/0194511 A1 Jun. 13, 2024

(30) Foreign Application Priority Data
Dec. 13, 2022 (KR) .......................... 10-2022-0173221

(51) Int. Cl.
*H01L 21/677* (2006.01)
(52) U.S. Cl.
CPC .... *H01L 21/67769* (2013.01); *H01L 21/6773* (2013.01); *H01L 21/67733* (2013.01); *H01L 21/67775* (2013.01)
(58) Field of Classification Search
CPC ........... H01L 21/67769; H01L 21/6773; H01L 21/67733; H01L 21/67775
See application file for complete search history.

(56) References Cited

U.S. PATENT DOCUMENTS

| | | | |
|---|---|---|---|
| 7,780,392 B2 * | 8/2010 | Rogers ............. | H01L 21/67769 414/940 |
| 9,266,153 B2 * | 2/2016 | Nagamine ................ | B08B 3/04 |
| 9,685,361 B2 * | 6/2017 | Yoshioka .......... | H01L 21/67775 |

(Continued)

FOREIGN PATENT DOCUMENTS

| | | | | |
|---|---|---|---|---|
| CN | 107529670 B | * | 8/2020 | ....... H01L 21/67748 |
| CN | 111599744 A | * | 8/2020 | .............. H05H 1/46 |

(Continued)

OTHER PUBLICATIONS

Korean Notice of Allowance dated Jul. 15, 2025 issued in corresponding Korean Patent Appln. No. 10-2022-0173221.

(Continued)

*Primary Examiner* — Jason C Smith
(74) *Attorney, Agent, or Firm* — Harness, Dickey & Pierce, P.L.C.

(57) ABSTRACT

A support unit is provided. The support unit supports transport items, which include a first storage having two or more first vertices formed on a bottom thereof and a second storage having second vertices formed on a bottom thereof, but at different locations from the first vertices, and store articles including substrates or consumables for manufacturing a semiconductor device, and includes: a base part forming a bottom surface; first block parts provided on the base part and including first separation prevention surfaces, on which the first vertices are positioned, and which face or adjoin circumferential surfaces or corners of the first storage; and second block parts provided on the first block parts and including second separation prevention surfaces, on which the second vertices are positioned, and which face or adjoin circumferential surfaces or corners of the second storage.

14 Claims, 14 Drawing Sheets

(56) References Cited

U.S. PATENT DOCUMENTS

| | | | | |
|---|---|---|---|---|
| 2009/0067957 A1* | 3/2009 | Ando | ................ | H01L 21/67775 |
| | | | | 414/222.05 |
| 2013/0269877 A1* | 10/2013 | Sun | ................... | H01L 21/67748 |
| | | | | 118/500 |
| 2022/0203415 A1* | 6/2022 | Kwak | ............... | H01L 21/67751 |
| 2024/0194511 A1* | 6/2024 | Kim | ................. | H01L 21/67733 |
| 2025/0018578 A1* | 1/2025 | Kanazawa | ........ | H01L 21/67742 |

FOREIGN PATENT DOCUMENTS

| | | | | | |
|---|---|---|---|---|---|
| EP | 4575635 | A1 * | 6/2025 | ......... | G03F 7/70741 |
| JP | H09221203 | A | 8/1997 | | |
| JP | 2024127842 | A * | 9/2004 | ....... | H01L 21/67766 |
| JP | 7361410 | B2 * | 10/2023 | ....... | H01L 21/02343 |
| JP | 2025094918 | A * | 6/2025 | .......... | B25J 11/0095 |
| KR | 20010006331 | A * | 1/2001 | ............... | B65G 1/14 |
| KR | 10-2001-0090230 | A | 10/2001 | | |
| KR | 100845909 | B1 * | 7/2008 | ....... | H01L 21/68764 |
| KR | 2015-0106360 | A | 9/2015 | | |
| KR | 2016-0066211 | A | 6/2016 | | |
| KR | 10-2018-0083263 | A | 7/2018 | | |
| KR | 10-2022-0085897 | A | 6/2022 | | |

OTHER PUBLICATIONS

Office Action for Korean Application No. 10-2022-0173221 dated Jul. 31, 2024.

* cited by examiner

[FIG. 1]
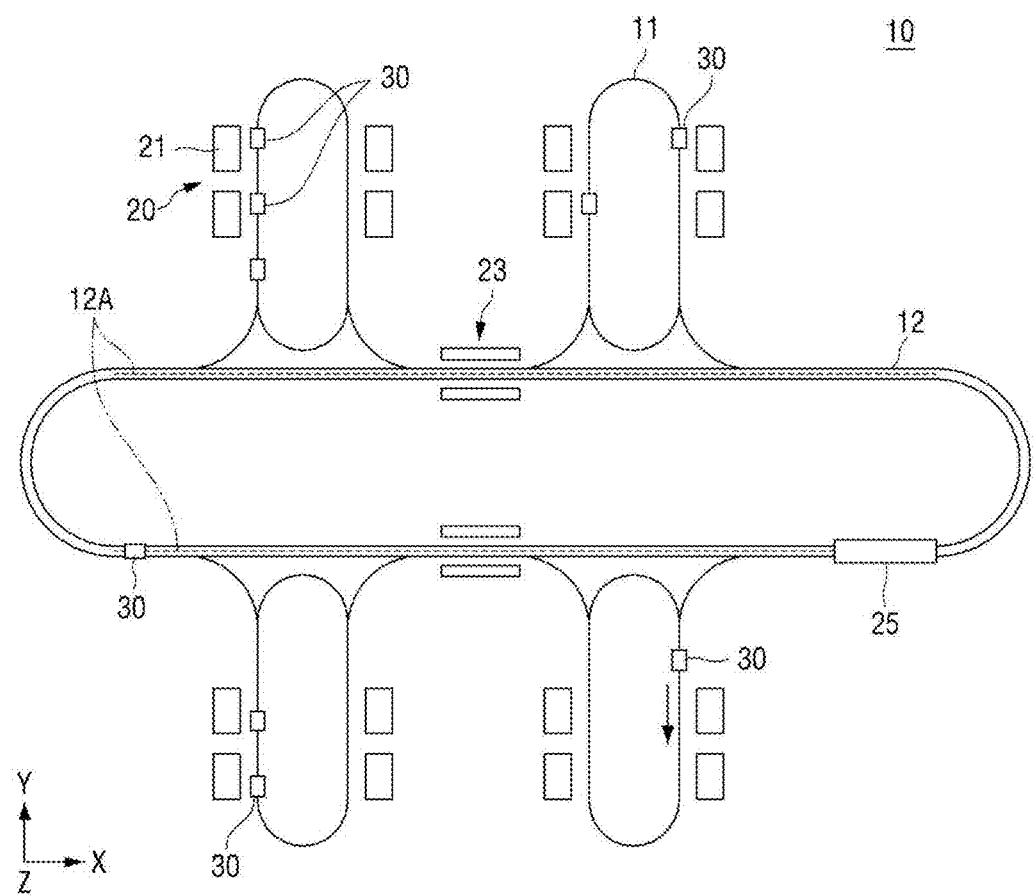

[FIG. 2]
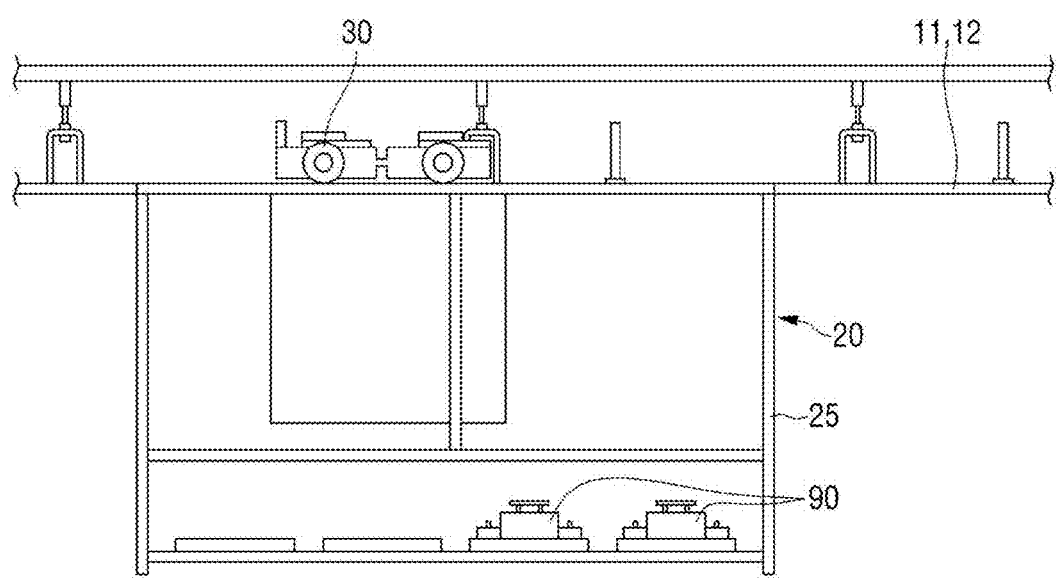

[FIG. 3]
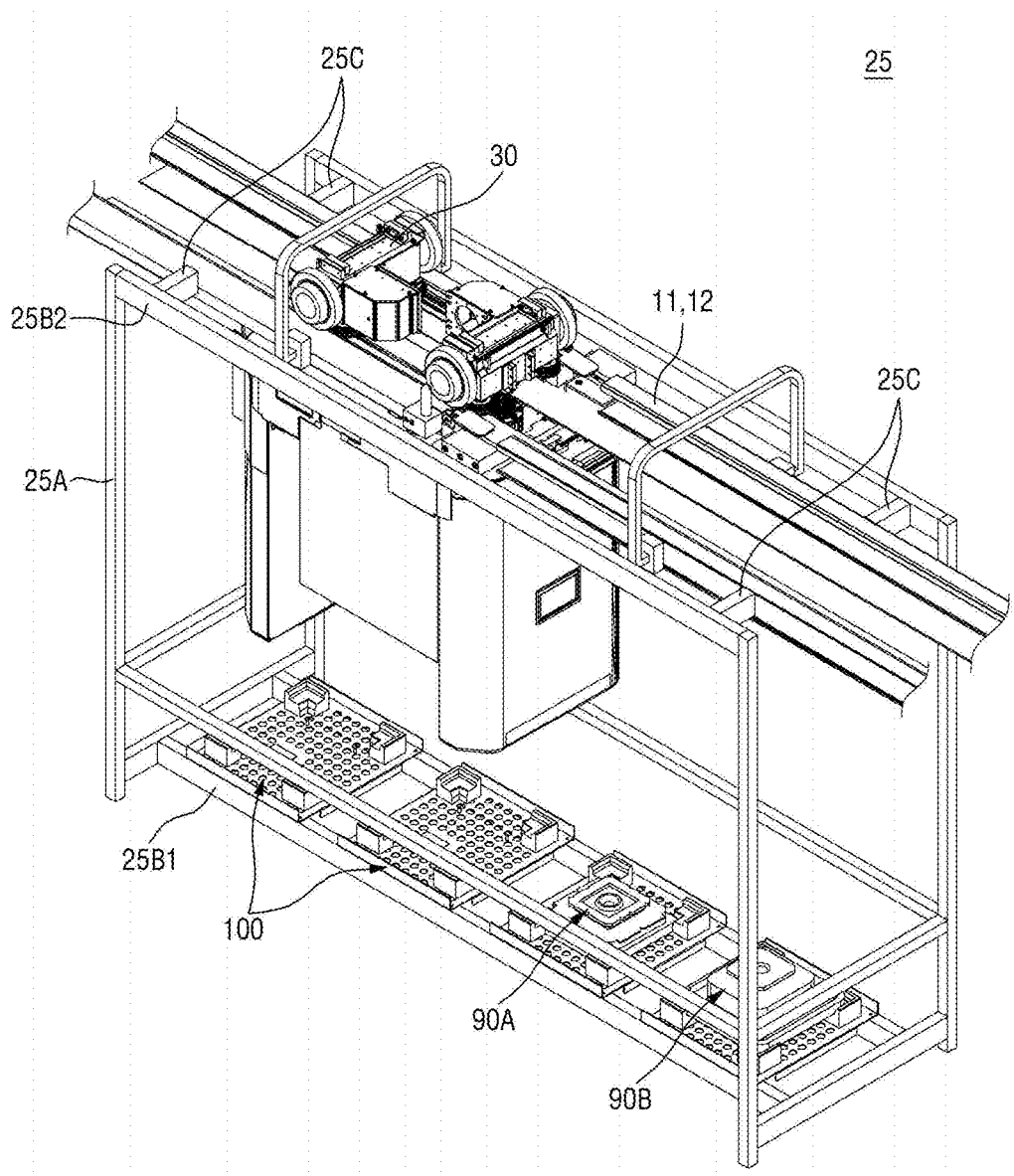

[FIG. 4]
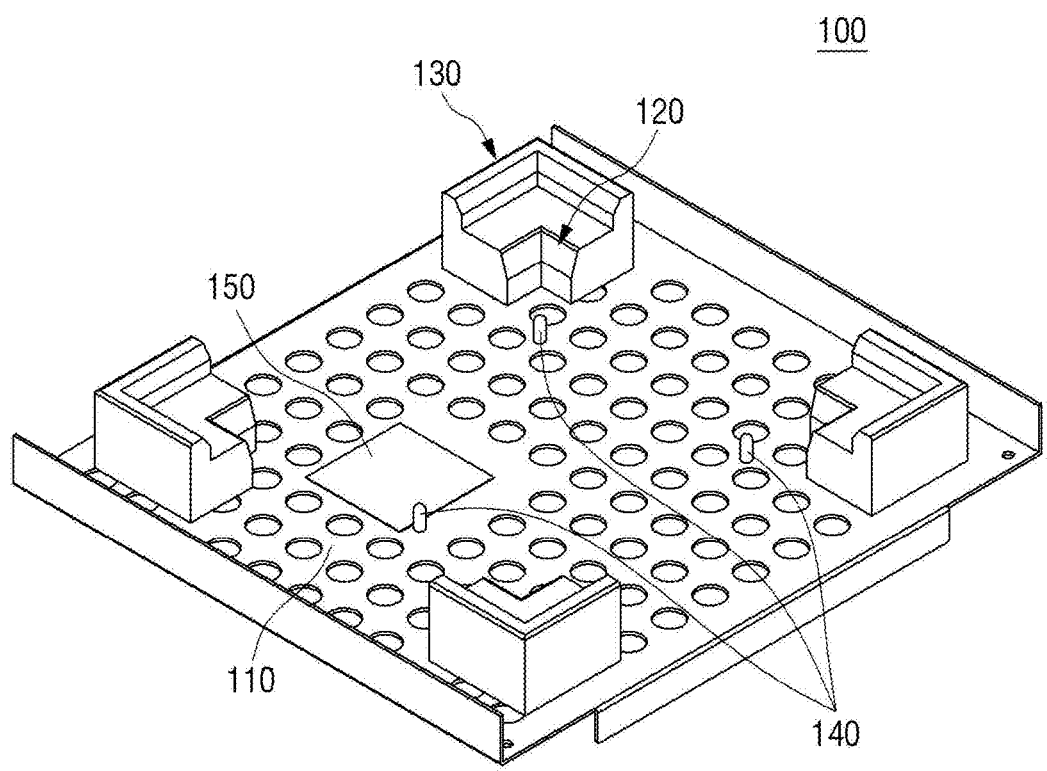

[FIG. 5]
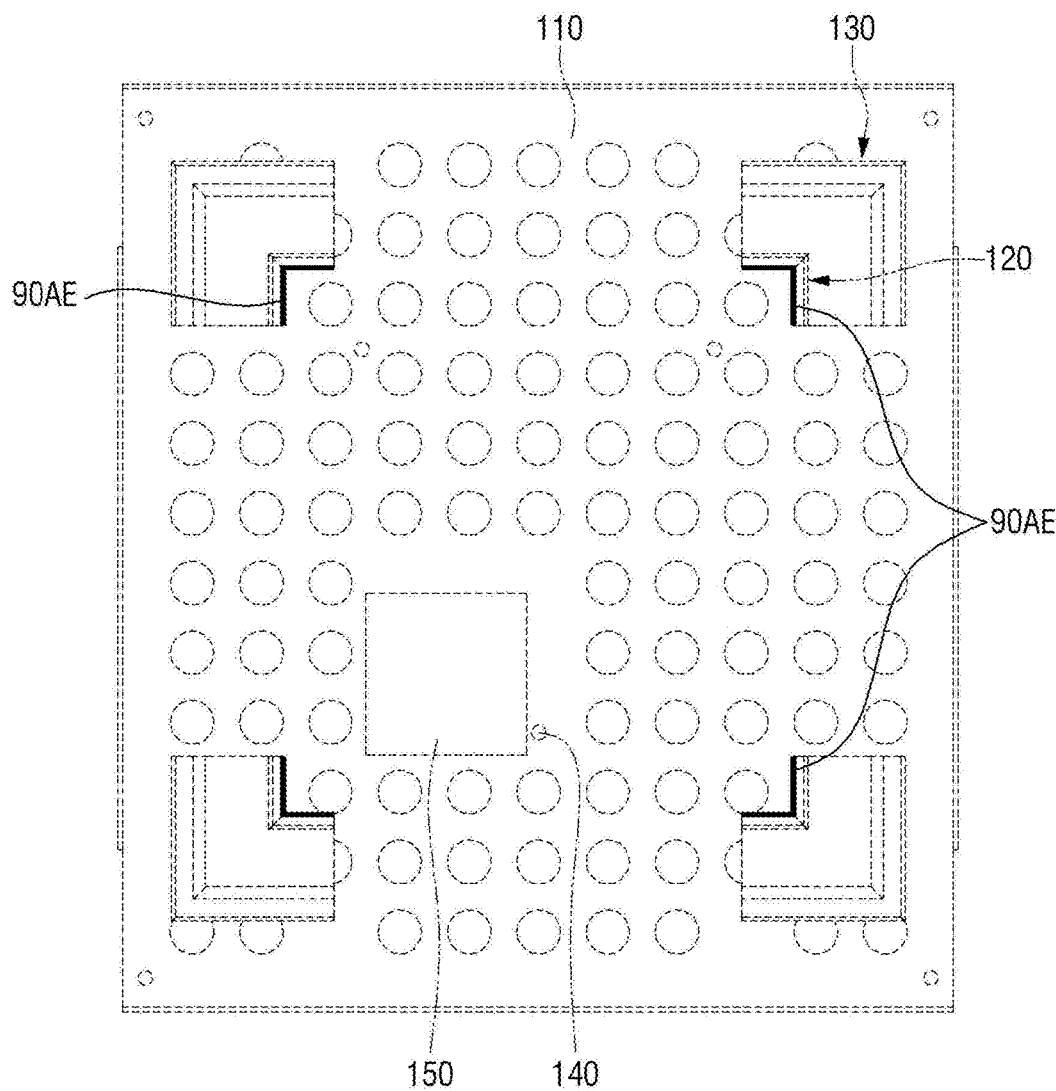

[FIG. 6]
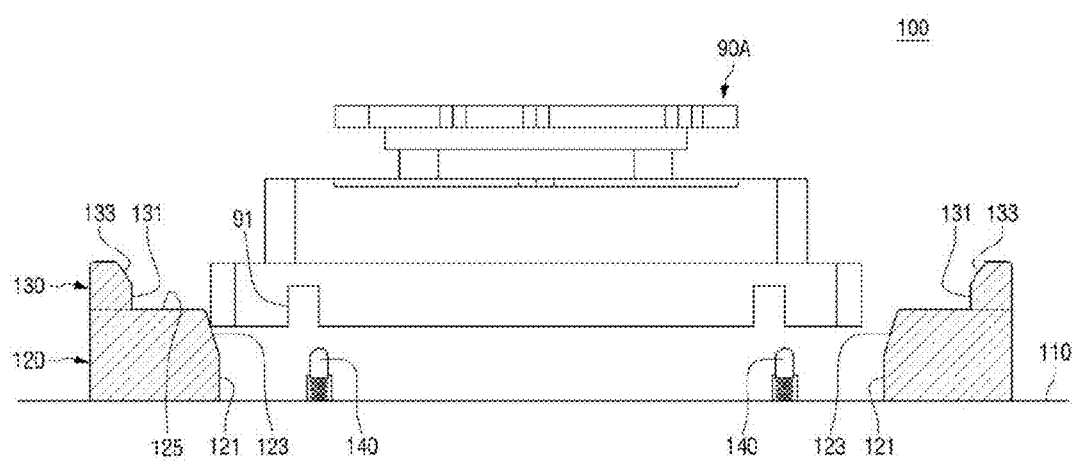

[FIG. 7]
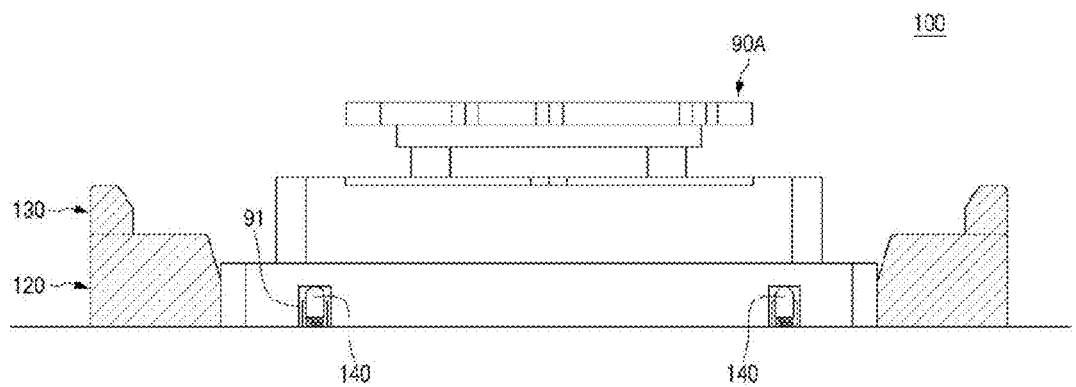

[FIG. 8]
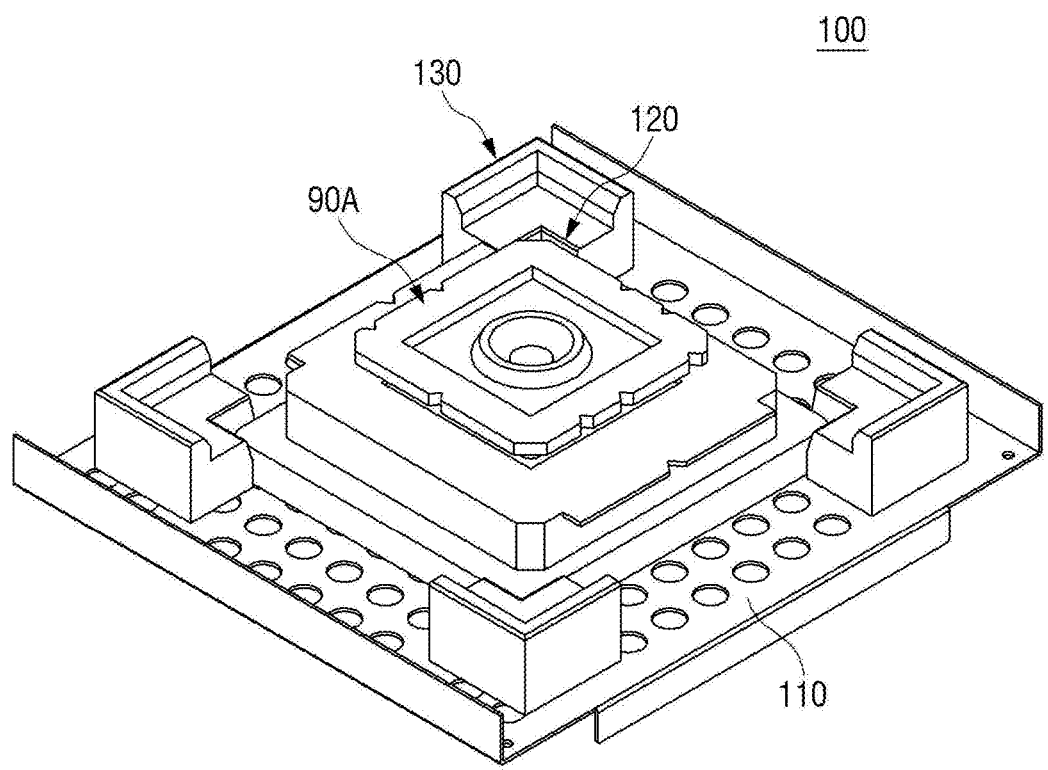

[FIG. 9]
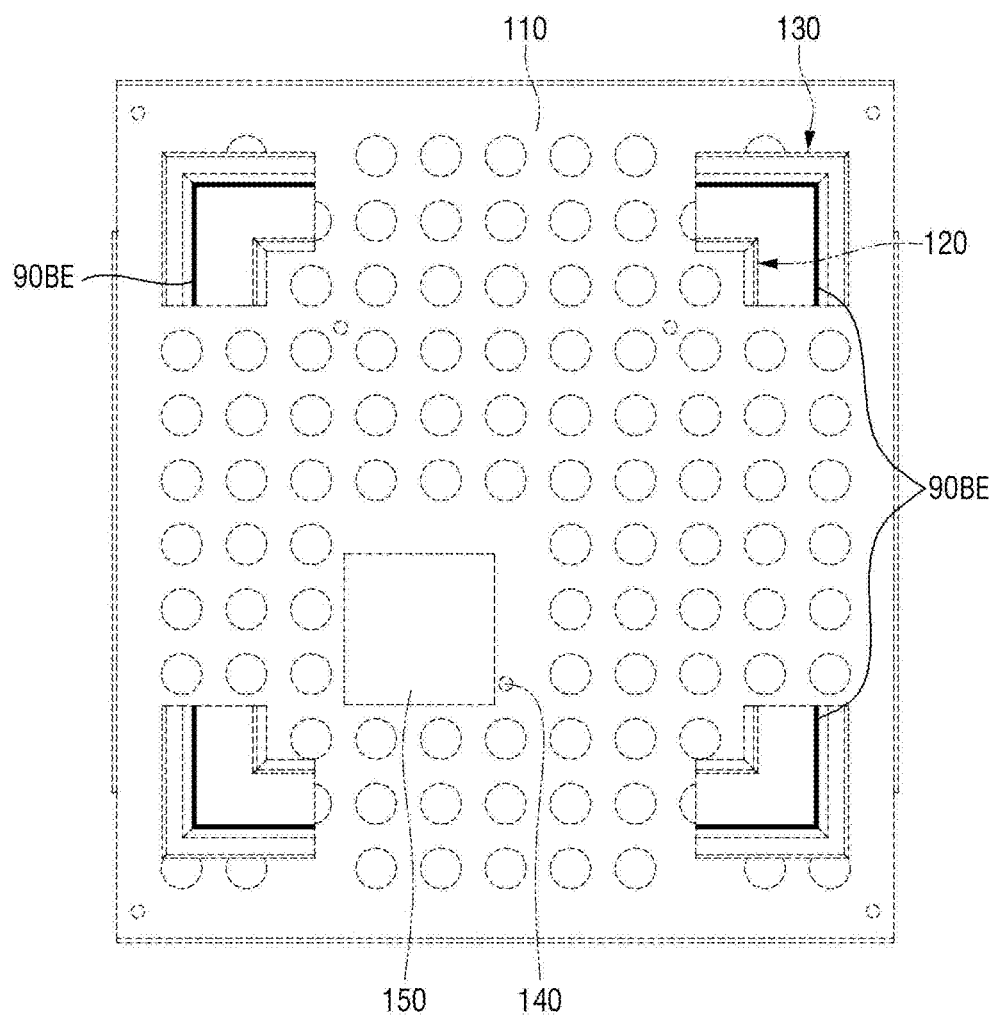

[FIG. 10]
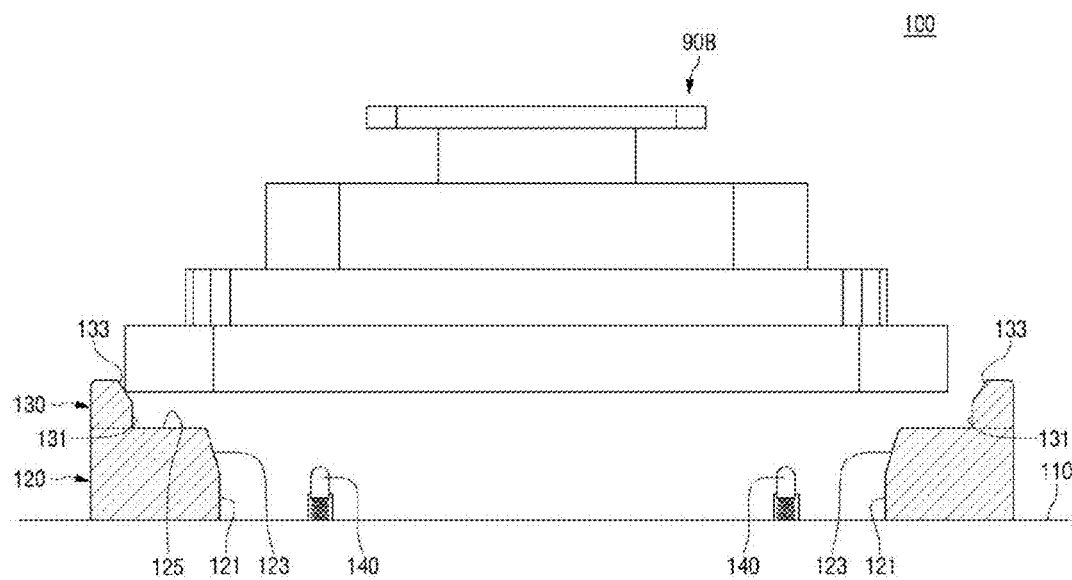

[FIG. 11]
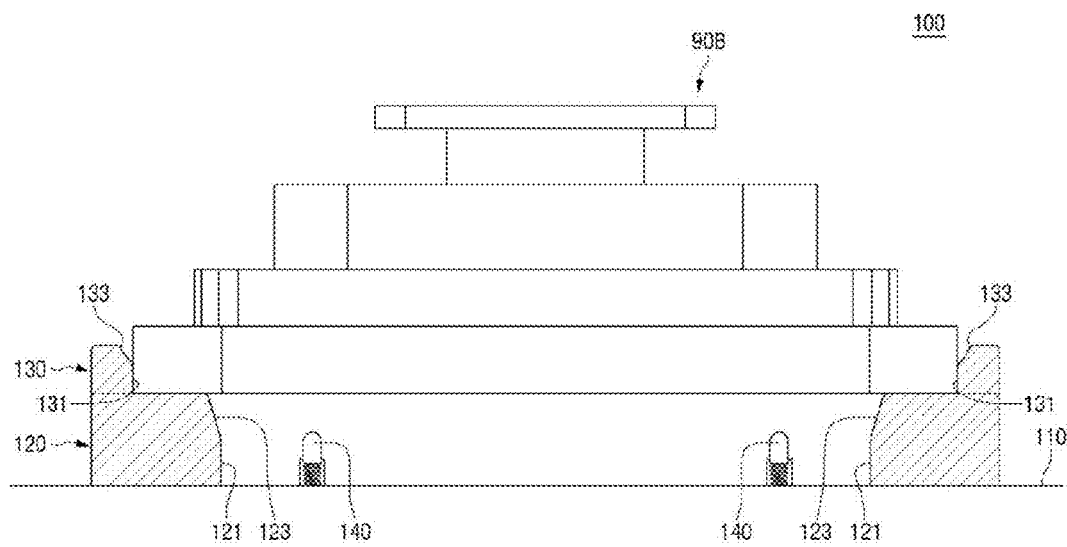

[FIG. 12]
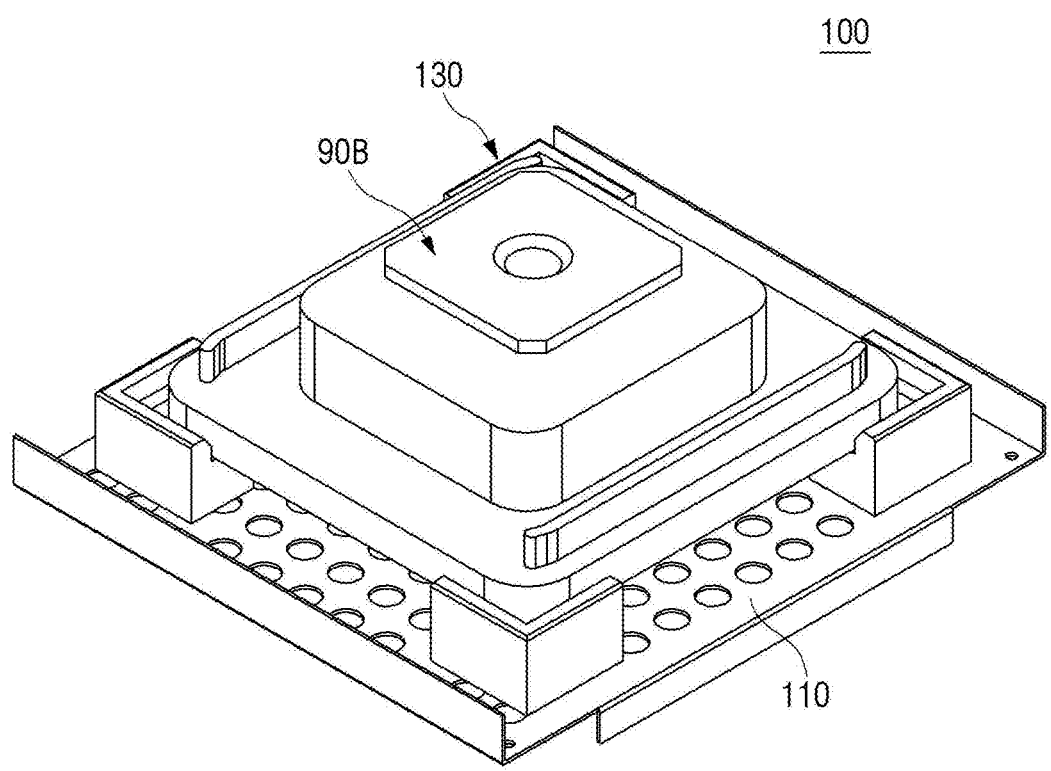

[FIG. 13]
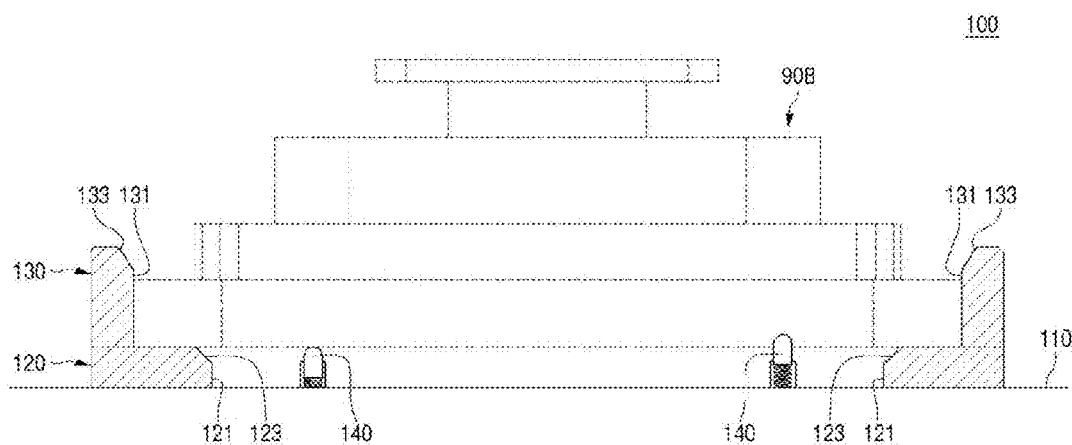

[FIG. 14]
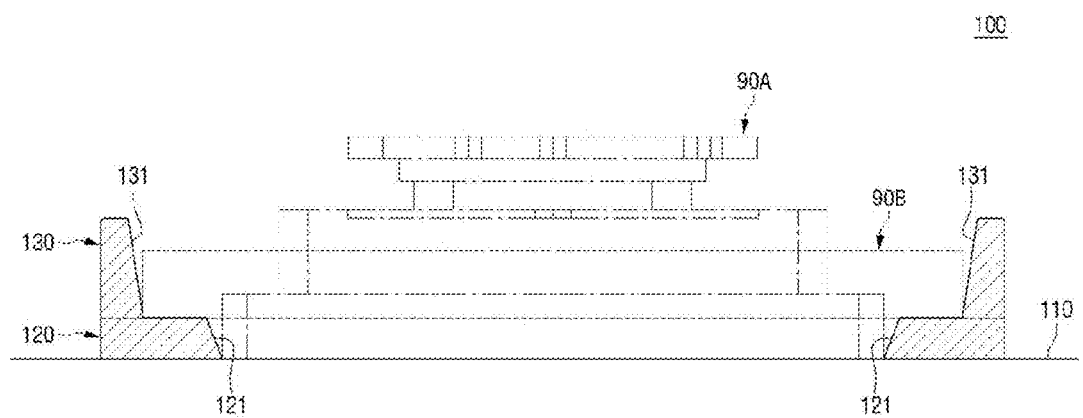

SUPPORT UNIT, LINE STORAGE UNIT, AND TRANSPORT SYSTEM INCLUDING THE SUPPORT UNIT

CROSS-REFERENCE TO RELATED APPLICATION

This application claims priority from Korean Patent Application No. 10-2022-0173221 filed on Dec. 13, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a support unit and a transport system including the same.

2. Description of the Related Art

Semiconductor manufacturing processes, which are processes of fabricating a semiconductor device on a substrate (or a wafer), includes, for exposure, exposure, deposition, etching, ion implantation, rinsing, and packaging. One or more layers of a facility for manufacturing a semiconductor device are provided as a cleanroom, and equipment for manufacturing a semiconductor device is arranged in each of the layers of the semiconductor manufacturing facility.

Processed substrates may be obtained by repeatedly performing multiple semiconductor manufacturing processes in the semiconductor manufacturing facility and may be transferred from one article receiving unit to another article receiving unit for each subsequent semiconductor manufacturing process. Here, the substrates may be transported while being stored in front opening unified pods (FOUPs). Also, consumables, such as reticles for use in an exposure process, may be transported in a state of being stored in pods. The FOUPs or the pods may be transported by an overhead hoist transport (OHT).

A stocker, an under track buffer (UTB), and a side track buffer (STB) may be provided around a rail, which provides a moving path for the OHT. For example, pods can be stored in the stocker, and FOUPs can be stored in the UTB and the STB.

Transported goods such as pods and FOUPs are transported to the stocker or the UTB, which is at a fixed location, but it may be efficient to store goods not in the stocker, but in the UTB (or vice versa), depending on the type of semiconductor manufacturing process. However, as the stocker, UTB, and STB are fixedly provided around the rail, a method is needed to improve the efficiency of conveyance.

SUMMARY

Aspects of the present disclosure provide a support unit which can store pods other than front opening unified pods (FOUPs) in an under track buffer (UTB) or a side track buffer (STB) and can thus improve line efficiency by changing the locations of FOUPs and pods without installation modifications to a stocker and the under track buffer (UTB), and also provide a line storage unit and a transport system including the support unit.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a support unit supports transport items, which include a first storage having two or more first vertices formed on a bottom thereof and a second storage having second vertices formed on a bottom thereof, but at different locations from the first vertices, and store articles including substrates or consumables for manufacturing a semiconductor device, and includes: a base part forming a bottom surface; first block parts provided on the base part and including first separation prevention surfaces, on which the first vertices are positioned, and which face or adjoin circumferential surfaces or corners of the first storage; and second block parts provided on the first block parts and including second separation prevention surfaces, on which the second vertices are positioned, and which face or adjoin circumferential surfaces or corners of the second storage.

According to an aspect of the present disclosure, a line storage unit includes: a frame unit provided near a rail, which provides a moving path for a transport cart, or connected to the rail; and the support unit.

According to an aspect of the present disclosure, a transport system includes: a transport cart; a rail providing a moving path for the transport cart; a frame unit including first horizontal parts, which are provided as horizontal bars, vertical parts, which extend upwardly from the first horizontal parts, second horizontal parts, which are parallel to the first horizontal parts and are provided at upper ends of the vertical parts, and intermediate parts, which connect the vertical parts or the second horizontal parts to the rail; and a support unit provided on the first horizontal parts and supporting transport items, which include a first storage having four first vertices formed on a bottom thereof and a second storage having second vertices formed on a bottom thereof, but at different locations from the first vertices, and store articles including substrates or consumables for manufacturing a semiconductor device. The transport items include pods, which accommodate the reticles, and front opening unified pods (FOUPs), which accommodate the substrates, and the support unit includes: a base part forming a bottom surface and including a perforated plate; four first block parts provided on the base part and including first separation prevention surfaces, on which the first vertices are positioned, and which surround corners of the first storage, form L-shaped structures having the same angle as the corners of the first storage, face or adjoin circumferential surfaces or the corners of the first storage, and are right-angled with respect to the base part, first support surfaces, which have upper ends in contact with a bottom surface of the second storage, and first inclined surfaces, which are upwardly inclined in an outward direction away from a direction toward the first storage, between the first support surfaces and the first separation prevention surfaces; second block parts provided on the four first block parts and including second separation prevention surfaces, on which the second vertices are positioned, and which surround corners of the second storage, form L-shaped structures having the same angle as the corners of the second storage, face or adjoin circumferential surfaces or the corners of the second storage, and are right-angled with respect to the first block parts, and second inclined surfaces, which extend from above the second separation prevention surfaces and are upwardly inclined in the outward direction; spring plungers protruding from the base part, between the first block parts, and having a lower part of the first storage fitted thereinto, and having a minimum height equal to, or less than, a height of the first support surfaces; and a reflector provided on the base part.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a schematic view of a transport system according to some embodiments of the present disclosure;

FIG. 2 is a front view of an article receiving unit provided in a rail of the transport system of FIG. 1;

FIG. 3 is a perspective view of the article receiving unit of FIG. 2;

FIG. 4 is a perspective view of a support unit according to a first embodiment of the present disclosure;

FIG. 5 illustrates first corners of a first storage to be received in the support unit of FIG. 4;

FIG. 6 is a cross-sectional view illustrating how to mount the first storage on the support unit of FIG. 4;

FIG. 7 is a cross-sectional view of the first storage seated on the support unit of FIG. 4;

FIG. 8 is a perspective view of the first storage seated on the support unit of FIG. 4;

FIG. 9 illustrates second corners of a second storage to be received in the support unit of FIG. 4;

FIG. 10 is a cross-sectional view illustrating how to mount the second storage on the support unit of FIG. 4;

FIG. 11 is a cross-sectional view of the second storage seated on the support unit of FIG. 4;

FIG. 12 is a perspective view of the second storage seated on the support unit of FIG. 4;

FIG. 13 is a cross-sectional view of a support unit according to a second embodiment of the present disclosure; and FIG. 14 is a cross-sectional view of a support unit according to a third embodiment of the present disclosure.

DETAILED DESCRIPTION

Preferred embodiments of the present disclosure will be described in detail with reference to the accompanying drawings. The present disclosure and methods of accomplishing the same may be understood more readily by reference to the following detailed description of embodiments and the accompanying drawings. However, the present disclosure may be embodied in many different forms, and should not be construed as being limited to the embodiments set forth herein. Rather, these embodiments are provided so that this disclosure will be through and complete and will fully convey the concept of the invention to those skilled in the art, and the present disclosure will only be defined by the appended claims. Like reference numbers designate like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a schematic view of a transport system according to some embodiments of the present disclosure.

Referring to FIG. 1, a transport system 10 may include a rail (11 and 12), article receiving units 20, and transport carts 30.

The rail (11 and 12) may provide a moving path along which the transport carts 30 moves to perform a task. The rail (11 and 12) may be installed at the ceiling and may have a structure in which straight lines and curves are combined. For a proper use of workspace and the ease of management of the transfer carts 30, the rail (11 and 12) may include a plurality of bays 11 where tasks are performed, and the bays 11 may be connected to one another via a passage 12. Accordingly, the transport carts 30 may be able to move not only within the bays 11, but move from one bay 11 to another bay 11 via the passage 12.

For example, the bays 11 may form closed loops and may be connected to the passage 12 by branching from, and merging back into, the passage 12.

Here, the passage 12 may be provided between the bays 11 or may branch from the bays 11. For example, referring to FIG. 1, multiple bays 11 may be provided for the passage 12, along the circumference of the passage 12, but the present disclosure is not limited thereto.

A power supply cable 12A, which supplies power to the transport carts 30 in a high-efficiency inductive power distribution (HID) or contactless power supply (CPS) method, may be provided in the rail (11 and 12). The power supply cable 12A may be installed in the entire rail (11 and 12) or part of the rail (11 and 12).

The article receiving units 20 may be provided around the rail (11 and 12). The article receiving units 20 may include semiconductor manufacturing facilities 21, a stocker 23, and a line storage unit 25. The semiconductor manufacturing facilities 21 and the stocker 23 may be provided near the rail (11 and 12). The line storage unit 25 may include an under track buffer (UTB) and a side track buffer (STB), which may be provided at or around the rail (11 and 12). The line storage unit 25 will be described later in detail.

The transport carts 30 may perform the task of moving articles such as substrates or reticles from an arbitrary start location to a destination during a semiconductor manufacturing process. For example, the transport carts 30 may carry front opening unified pods (FOUPs) containing substrates or pods containing reticles from one article receiving unit 20 to another article receiving unit 20. That is, transport items 90 such as FOUPs or pods may be transported by the transport carts 30.

The transport carts 30 may move along the rail (11 and 12). For example, the transport carts 30 may be provided as overhead hoist transports (OHTs) to efficiently transport goods. The transport carts 30 may be provided with batteries or may be supplied with power from the power supply cable 12A.

The line storage unit 25 will hereinafter be described.

The transport items 90 may be provided as pods or FOUPs. The transport items 90 may include first and second storages 90A and 90B, which have different sizes. For example, pods storing reticles may have different sizes depending on the types of the reticles. The first storage 90A will hereinafter be described as, but is not limited to, being a first pod storing a first-type reticle, and the second storage 90B will hereinafter be described as, but is not limited to, being a second pod storing a second-type reticle.

Two or more first vertices may be formed at a lower end of the first storage 90A, and two or more second vertices may be formed at a lower end of the second storage 90B. Each of the first and second storages 90A and 90B will hereinafter be described as having, for example, four vertices, at the lower end thereof. The second storage 90B may have a different size from the first storage 90A, and thus, the locations of the first vertices may differ from the locations of the second vertices.

Four vertices may be formed at each of the transport items 90, but the present disclosure is not limited thereto. Alternatively, the corners of each of the transport items 90 may be chamfered and/or rounded, and the shape and structure of the transport items 90 may vary.

FIGS. 2 and 3 illustrate an article receiving unit provided at the rail of the transport system of FIG. 1.

Referring to FIGS. 2 and 3, a line storage unit 25 of an article receiving unit 20 may be, for example, a UTB or an STB. FOUPs may be stored in the line storage unit 25. Support units 100 may be provided in the line storage unit 25 and may store pods other than FOUPs. The line storage unit 25 will hereinafter be described as being provided as a UTB. The UTB may be provided not to interfere with the movement of a transport cart 30 on the rail (11 and 12).

However, the present disclosure is not limited to this. Alternatively, the line storage unit 25 may be provided as an STB. The transport cart 30 may be provided with a hoist and/or a sliding device to move transport items 90 in a horizontal direction. Alternatively, a sliding device may be provided to the STB so that a structure such as a support may be slidable in the direction of the transport cart 30.

The line storage unit 25 may include a frame unit (25A, 25B1, 25B2, and 25C) and the support units 100.

The frame unit (25A, 25B1, 25B2, and 25C) may have a structure in which multiple bars are combined and may include, for example, vertical parts 25A, first horizontal parts 25B1, second horizontal parts 25B2, and intermediate parts 25C, but the present disclosure is not limited thereto.

FOUPs (or supports for FOUPs) or the support units 100 may be installed on the first horizontal parts 25B1. The first horizontal parts 25B1 may be provided as a pair of parallel bars extending in the horizontal direction. Alternatively, the first horizontal parts 25B1 may be provided as a rectangular frame or plate, and various modifications may be made to the structure of the first horizontal parts 25B1.

The vertical parts 25A may extend in an upward direction from both ends of each of the first horizontal parts 25B1 to form space above the first horizontal parts 25B1. The vertical parts 25A may be provided as four bars provided at the ends of each of the first horizontal parts 25B1. The vertical parts 25A may also be provided in the middle of each of the first horizontal parts 25B1 to reinforce rigidity. The first horizontal parts 25B1 may be further provided in the length direction of the vertical parts 25A to reinforce rigidity.

The second horizontal parts 25B2 may be provided at the upper ends of each of the vertical parts 25A to be in parallel to the first horizontal parts 25B1. The second horizontal parts 25B2 may be provided in parallel to the rail (11 and 12), in the horizontal direction, but the present disclosure is not limited thereto.

The intermediate parts 25C may connect the second horizontal parts 25B2 (or the vertical parts 25A) and the rail (11 and 12). The intermediate parts 25C may connect the second horizontal parts 25B2 and the rail (11 and 12) such that the vertical parts 25A and the second horizontal parts 25B2 may not interfere with the transport cart 30, which moves along the rail (11 and 12), but the present disclosure is not limited thereto.

For example, the intermediate parts 25C may be provided as bars that are shorter than the first horizontal parts 25B1, the second horizontal parts 25B2, and the vertical parts 25A. In another example, the intermediate parts 25C may be provided as brackets, and various other structures capable of connecting the second horizontal parts 25B2 and the rail (11 and 12) may be possible.

The support units 100 will hereinafter be described.

FIGS. 4 through 12 illustrate a support unit according to a first embodiment of the present disclosure.

Referring to FIGS. 4 through 12, a support unit 100 may support a transport item 90 and may be provided on the first horizontal parts 25B1. For example, the support unit 100 may include a base part 110, first block parts 120, second block parts 130, spring plungers 140, and a reflector 150.

The base part 110 may form the bottom surface of the support unit 110 and may be provided as a perforated plate. The base part 110 have a structure in which one transport item 90 is accommodated on one plate. Multiple base parts 110 may be provided in the frame unit (25A, 25B1, 25B2, and 25C). For example, if the frame unit (25A, 25B1, 25B2, and 25C) has a structure capable of storing one pod and three FOUPs, four base parts 110 may be provided in the frame unit (25A, 25B1, 25B2, and 25C). On the other hand, if the frame unit (25A, 25B1, 25B2, and 25C) has a structure capable of storing one pod and three FOUPs, one base part 110 may be installed in the frame unit (25A, 25B1, 25B2, and 25C). The number of base parts 110 installed in the frame unit (25A, 25B1, 25B2, and 25C) may vary depending on the numbers of FOUPs and pods to be stored.

The base part 110 may have a structure in which multiple transport items 90 are accommodated on one plate. That is, a number of first block parts 120 may be provided to be able to fix one transport item 90 or two or more transport items 90 on one base part 110.

The base part 110 may be provided with bolting holes and may be coupled to the frame unit (25A, 25B1, 25B2, and 25C) in a bolting manner, may be fixed to the frame unit (25A, 25B1, 25B2, and 25C) via a magnet, or may be fixed to the frame unit (25A, 25B1, 25B2, and 25C) through a combination of bolts and magnets. In other words, the base part 110 may be provided in a detachable structure such that the support unit 100 may be detached from the line storage unit 25 to store FOUPs in the line storage unit 25 or may be attached to the line storage unit 25 to store pods in the line storage unit 25.

The first block parts 120 may set and fix the location of a first storage 90A. For example, a pair of first block parts 120 may be provided on the base part 110 and may be positioned at locations corresponding to two first vertices, in a diagonal direction, of the first storage 90A. In another example, four first block parts 120 may be provided on the base part 110 and may be positioned at locations corresponding to four first vertices of the first storage 90A.

Referring to FIG. 5, the first block parts 120 may surround corners of the first storage 90A and may be formed as L-shaped structures having the same angle as the corners of the first storage 90A.

The term "vertex" or "vertices", as used herein, is not limited to a vertex or vertices formed by straight lines. In other words, the support unit 100, which is a structure for accommodating a transport item 90 therein, may have a shape corresponding to the shape of a lower part of the transport item 90 or a shape capable of guiding the lower part of the transport item 90. Thus, the first block parts 120 and the second block parts 130 may be formed as curved L-shaped structures, rather than as angled L-shaped structures, forming curves.

The first block parts 120 may face or adjoin first corners 90AE of the first storage 90A, which form the first vertices, or the circumferential surfaces of the first storage 90A. For example, the first block parts 120 may include first separation prevention surfaces 121, first inclined surfaces 123, and first support surfaces 125.

The first separation prevention surfaces 121, which are for fixing the location of the first storage 90A, may be right-angled with respect to the base part 110, but the present disclosure is not limited thereto. Other exemplary first separation prevention surfaces 121 will be described later with reference to FIG. 14.

The distance between every two opposing first separation prevention surfaces 121 may be the same as the width or the length of the first storage 90A. That is, the lower ends of the first separation prevention surfaces 121 may be in contact with the first storage 90A. Thus, if the first separation prevention surfaces 121 are right-angled with respect to the base part 110, the circumferential surfaces of the first storage 90A, which form the first corners 90AE, may be in contact with the first separation prevention surfaces 121. Accordingly, even if an external force is applied to the first storage 90A, the first storage 90A may not be able to wobble, but may be stably fixed. Gaps may be formed between the first storage 90A and the first separation prevention surfaces 121.

The first inclined surfaces 123 may be upwardly inclined toward the outside of the first storage 90A, between the first support surfaces 125 and the first separation prevention surfaces 121. First block parts 120 facing one another may form pairs, and a lower part of the first storage 90A may be guided between each pair of adjacent first inclined surfaces 121 and may thus enter the space between the first block parts 120.

The first support surfaces 125, which support a second storage 90B, may adjoin the bottom surface of the second storage 90B and may be planes that are parallel to the base part 110. The second block parts 130 may be integrally provided on the first support surfaces 125. For example, the second block parts 130 may be provided at the edges of pairs of adjacent first support surfaces 125.

The second block parts 130 may be provided on the first block parts 120. The second block parts 130 may surround the corners of the second storage 90B. The second block parts 130 may be positioned at locations corresponding to second vertices of the second storage 90B or may face or adjoin second corners 90BE of the second storage 90B, which form the second vertices, or the circumferential surfaces of the second storage 90B. For example, the second block parts 130 may include second separation prevention surfaces 131 and second inclined surfaces 133.

The second separation prevention surfaces 131, which are for fixing the location of the second storage 90B, may be right-angled with respect to the first block parts, but the present disclosure is not limited thereto. Other exemplary second separation prevention surfaces 131 will be described later with reference to FIG. 14.

The distance between every two opposing second separation prevention surfaces 131 may be the same as the width of the second storage 90B. That is, the lower ends of the second separation prevention surfaces 131 may be in contact with the second storage 90B. Thus, if the second separation prevention surfaces 131 are right-angled with respect to the base part 110 and the first block parts 120, the circumferential surfaces of the second storage 90B, which form the second corners 90BE, may be in contact with the second separation prevention surfaces 131.

Accordingly, even if an external force is applied to the second storage 90B, the second storage 90B may not be able to wobble, but may be stably fixed. Gaps may be formed between the second storage 90B and the second separation prevention surfaces 131.

The second inclined surfaces 133 may be upwardly inclined from the second separation prevention surfaces 131 toward the outside of the second storage 90B. Second block parts 130 facing one another may form pairs, and a lower part of the second storage 90B may be guided between each pair of adjacent second inclined surfaces 131 and may thus enter the space between the second block parts 130.

The spring plungers 140 may be fitted into the lower part of the first storage 90A. For example, the spring plungers 140 may be fitted into fitting grooves 91 of the first storage 90A. The spring plungers 140 may protrude from the base part 110, between the first block parts 120. The spring plungers 140 may have a minimum height that allows the spring plungers 140 to be accommodated in the fitting grooves 91 of the first storage 90A. The height of the spring plungers 140 may be set to be the same as, or less than, the height of the first support surfaces 125 so as not to push away the bottom surface of the second storage 90B.

The reflector 150 may be provided on the base part 110. For example, the reflector 150 may reflect light applied by a sensor (not illustrated) provided in the transport cart 30 or the frame unit (25A, 25B1, 25B2, and 25C). For example, when the transport item 90 is positioned on the support unit 100, the reflector 150 is covered by the transport item 90 and is thus unable to reflect light applied by the sensor, and thus, the transport item 90 is determined as being disposed on the support unit 100.

It will hereinafter be described how to mount the first storage 90A on the support unit 100 with reference to FIGS. 5 through 7.

In short, the lower part of the first storage 90A may be guided between pairs of opposing first inclined surfaces 123 and may thus enter the space between the first block parts 120.

Referring to FIG. 5, as every two bracket-type first block parts 120 horizontally spaced apart horizontally from each other form a pair and every two bracket-type first block parts 120 vertically spaced apart from each other form a pair, four circumferential surfaces of the first storage 90A may be guided by the first inclined surfaces 123 of the first block parts 120 and may thus enter the space between the first block parts 120.

Referring to FIGS. 6 and 7, a pair of opposing first inclined surfaces 123 may form a tapered structure whose width increases in the upward direction, and thus, the first storage 90A does not need to be placed at the exact locations of the first separation prevention surfaces 121. That is, once the first storage 90A enters an expanded area formed by the first inclined surfaces 123, the transport item 90 does not need to be placed on the support unit 100 while finely adjusting the location of the transport item 90 in accordance with the horizontal cross-sectional area between the first separation prevention surfaces 121, which is less than the horizontal cross-sectional area between the upper ends of the first inclined surfaces 123. Accordingly, the amount of time required to adjust the location of the transport item 90 can be reduced.

Referring to FIGS. 9 through 11, the second storage 90B may be seated on the support unit 100. In short, the lower part of the second storage 90B may be guided between a pair of opposing second inclined surfaces 133 and may thus enter the space between the second block parts 130.

A method in which the second storage 90B is seated on the first block parts 120 by being lowered under the guidance of the second block parts 130 is the same as, or similar to, a method in which the first storage 90A is seated on the first block parts 120 by being lowered under the guidance of by the first block parts 120, which have a tapered shape, and thus, a detailed description thereof will be omitted.

Modified examples of the support unit according to the first embodiment of the present disclosure will hereinafter be described with reference to FIGS. 13 and 14. Like reference numerals indicate like elements throughout the specification, and thus, detailed descriptions thereof will be omitted.

FIG. 13 is a cross-sectional view of a support unit according to a second embodiment of the present disclosure. The second embodiment of the present disclosure will hereinafter be described, focusing mainly on the differences with the first embodiment of the present disclosure.

Referring to FIG. 13, a support unit 100, like its counterpart according to the first embodiment of the present disclosure, may include a base part 110, first block parts 120, second block parts 130, spring plungers 140, and a reflector 150.

The spring plungers 140 may be provided to be in contact with the bottom surface of a second storage 90B, and the minimum height of the spring plungers 140, which is the height of the spring plungers 140 with their springs pressed, may be set to be the same as the height of first support surfaces 125 so as not to push away the second storage 90B.

FIG. 14 is a cross-sectional view of a support unit according to a third embodiment of the present disclosure. The third embodiment of the present disclosure will hereinafter be described, focusing mainly on the differences with the first and second embodiments of the present disclosure.

Referring to FIG. 14, a support unit 100, like its counterpart according to the first or second embodiment of the present disclosure, may include a base part 110, first block parts 120, second block parts 130, spring plungers 140, and a reflector 150.

The first block parts 120 do not include first inclined surfaces 123, and first separation prevention surfaces 121 of the first block parts 120 may not be perpendicular, but may be inclined. That is, the first separation prevention surfaces 121, like the first inclined surfaces 123 of any one of FIGS. 4 through 13, may be upwardly inclined toward the outside of the support unit 100.

Thus, a first storage 90A entering the support unit 100 along the first separation prevention surfaces 121 may be finally positioned to be in contact with the lower ends of the first separation prevention surfaces 121. That is, the first block parts 120, like the first block parts 120 of FIGS. 4 through 12, may guide the first storage 90A with its tapered structure, but the first storage 90A may be able to be fixed on the first separation prevention surfaces 121.

The second block parts 130 do not include second inclined surfaces 133, and second separation prevention surfaces 131 of the second block parts 130 may not be perpendicular, but may be tapered. That is, the second separation prevention surfaces 131 may be upwardly inclined toward the outside of the support unit 100.

Thus, a second storage 90B entering the support unit 100 along the second separation prevention surfaces 131 may be finally positioned to be in contact with the lower ends of the second separation prevention surfaces 131. That is, the second block parts 130, like the first block parts 130 of FIGS. 4 through 12, may guide the second storage 90B with its tapered structure, but the second storage 90B may be able to be fixed on the second separation prevention surfaces 131.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. A support unit configured to support transport items including a first storage having two or more first vertices formed on a bottom surface of the first storage and a second storage having second vertices formed on a bottom surface of the second storage, the second vertices being at different locations from the two or more first vertices, and the support unit further configured to store articles including substrates or consumables for manufacturing a semiconductor device, the support unit comprising:
   a base part adjacent to a rail and forming a bottom surface,
   a frame unit provided adjacent to the rail or connected to the rail, the rail providing a moving path for a transport cart;
   first block parts provided on the base part and the first block parts including first separation prevention surfaces, on which the two or more first vertices are positioned, and which face or adjoin circumferential surfaces or corners of the first storage; and
   second block parts provided on the first block parts and the second block parts including second separation prevention surfaces, on which the second vertices are positioned, and which face or adjoin circumferential surfaces or corners of the second storage;
   protruding parts protruding from the base part, between the first block parts,
   wherein
   the first block parts surround the corners of the first storage and form first L-shaped structures having a same angle as the corners of the first storage,
   the second block parts surround the corners of the second storage and form second L-shaped structures having a same angle as the corners of the second storage,
   a lower part of the first storage is fitted into the protruding parts,
   the protruding parts include spring plungers, and
   the spring plungers are configured to be pressed in response to the second storage being placed on the base part, the spring plungers contacting the bottom surface of the second storage.

2. The support unit of claim 1, wherein the first block parts further include first support surfaces, which have upper ends in contact with a bottom surface of the second storage and are connected to the second separation prevention surfaces.

3. The support unit of claim 2, wherein the first block parts further include first inclined surfaces, which are upwardly inclined in an outward direction away from the first storage, between the first support surfaces and the first separation prevention surfaces.

4. The support unit of claim 2, wherein a minimum height of the spring plungers is equal to, or less than, a height of the first support surfaces.

5. The support unit of claim 1, wherein the second block parts further include second inclined surfaces, which extend from above the second separation prevention surfaces and are upwardly inclined in an outward direction.

6. The support unit of claim 1, wherein the first separation prevention surfaces and the second separation prevention surfaces are right-angled with respect to the base part.

7. The support unit of claim 1, wherein the transport items include pods, which accommodate reticles, and front opening unified pods (FOUPs), which accommodate the substrates.

8. The support unit of claim 1, further comprising:
a reflector provided on the base part.

9. The support unit of claim 1, wherein
four first vertices are provided at the bottom surface of the first storage, and
a pair of the first block parts or a number of the first block parts corresponding to a number of first vertices may be provided along one or more diagonal directions of the first storage.

10. The support unit of claim 1, wherein the base part includes a perforated plate.

11. A line storage unit comprising:
the support unit of claim 1,
wherein the line storage unit is configured to store the first storage and the second storage in different locations from each other on the base part.

12. The line storage unit of claim 11, wherein the frame unit includes first horizontal parts, on which the support unit is provided, vertical parts, which extend upwardly from the first horizontal parts, and second horizontal parts, which are parallel to the first horizontal parts and are provided at upper ends of the vertical parts.

13. The line storage unit of claim 12, wherein the frame unit further includes intermediate parts, which connect the vertical parts or the second horizontal parts to the rail.

14. A transport system comprising:
a transport cart;
a rail providing a moving path for the transport cart;
a frame unit including first horizontal parts, which are provided as horizontal bars, vertical parts, which extend upwardly from the first horizontal parts, second horizontal parts, which are parallel to the first horizontal parts and are provided at upper ends of the vertical parts, and intermediate parts, which connect the vertical parts or the second horizontal parts to the rail; and
a support unit provided on the first horizontal parts and configured to support transport items including a first storage having four first vertices formed on a bottom surface of the first storage and a second storage having second vertices formed on a bottom of the second storage, the second vertices being at different locations from the four first vertices, and the support unit further configured to store articles including substrates or consumables for manufacturing a semiconductor device,
wherein
the transport items include pods, which accommodate reticles, and front opening unified pods (FOUPs), which accommodate the substrates, and
the support unit includes:
a base part forming a bottom surface and including a perforated plate;
four first block parts provided on the base part and including first separation prevention surfaces, on which the four first vertices are positioned, and which surround corners of the first storage, form first L-shaped structures having a same angle as the corners of the first storage, face or adjoin circumferential surfaces or the corners of the first storage, and are right-angled with respect to the base part, first support surfaces, which have upper ends in contact with a bottom surface of the second storage, and first inclined surfaces, which are upwardly inclined in an outward direction away from a direction toward the first storage, between the first support surfaces and the first separation prevention surfaces;
second block parts provided on the four first block parts and including second separation prevention surfaces, on which the second vertices are positioned, and which surround corners of the second storage, form second L-shaped structures having a same angle as the corners of the second storage, face or adjoin circumferential surfaces or the corners of the second storage, and are right-angled with respect to the four first block parts, and second inclined surfaces, which extend from above the second separation prevention surfaces and are upwardly inclined in the outward direction;
spring plungers protruding from the base part, between the four first block parts, and having a lower part of the first storage fitted thereinto, and having a minimum height equal to, or less than, a height of the first support surfaces; and
a reflector provided on the base part,
wherein the spring plungers are configured to be pressed in response to the second storage being placed on the base part, the spring plungers contacting the bottom surface of the second storage.

* * * * *